US006184546B1

(12) United States Patent
Liu et al.

(10) Patent No.: US 6,184,546 B1
(45) Date of Patent: Feb. 6, 2001

(54) HIGH BARRIER GATE AND TRI-STEP DOPED CHANNEL FIELD-EFFECT TRANSISTOR

(75) Inventors: W. C. Liu, Tainan; W. S. Lour, Keelung; W. L. Chang, Tainan, all of (TW)

(73) Assignee: National Science Council, Taipei (TW)

( * ) Notice: Under 35 U.S.C. 154(b), the term of this patent shall be extended for 0 days.

(21) Appl. No.: 09/315,765

(22) Filed: May 20, 1999

(30) Foreign Application Priority Data

Aug. 5, 1998 (TW) .............................................. 87112910

(51) Int. Cl.[7] ............................................ H01L 31/0328

(52) U.S. Cl. ............................ 257/192; 257/12; 257/194

(58) Field of Search .................................. 257/192, 194, 257/195, 12, 20, 24

(56) References Cited

U.S. PATENT DOCUMENTS

| | | | |
|---|---|---|---|
| 5,389,802 * | 2/1995 | Ohno | 257/194 |
| 5,521,404 * | 5/1996 | Kikkawa et al. | 257/194 |
| 5,548,139 * | 8/1996 | Ando | 257/192 |
| 5,635,735 * | 6/1997 | Miyamoto et al. | 257/192 |
| 5,701,020 * | 12/1997 | Liu et al. | 257/192 |
| 5,789,771 * | 8/1998 | Liu et al. | 257/287 |

* cited by examiner

*Primary Examiner*—Steven H. Loke
*Assistant Examiner*—Shouxiang Hu
(74) *Attorney, Agent, or Firm*—Ladas & Parry

(57) ABSTRACT

A high-barrier gate field-effect transistor with an $n^+$-GaAs/$p^+$-GaInP/n-GaAs heterojunctions has been fabricated. The channel contains tri-step doped GaAs layers with a different doping level and thickness in each layer. Due to the significant conduction band discontinuity $\Delta E_C$ between GaInP/GaAs heterointerface in the gate region, the gate barrier is increased and electrons are effectively confined in the channel. Furthermore, the existence of a valance band discontinuity $\Delta E_v$ at the GaInP/GaAs heterointerface may prevent holes generated by impact ionization from reaching the gate region. The tri-step doped channel is adopted to increase the output current and linear transconductance. Therefore the device of this invention provides a high gate-drain breakdown voltage, a low leakage current and a high transconductance. Based on these advantages, the proposed device shows the promise for high-power, large signal analog, and digital switching circuit applications.

12 Claims, 4 Drawing Sheets

10
38 34 36
32
30
28a
28b
28c
28
26
24
22
20

HIGH BARRIER GATE AND TRI-STEP DOPED CHANNEL FIELD-EFFECT TRANSISTOR

BACKGROUND OF THE INVENTION

1. Field of the Invention

This invention relates to a semiconductor device, and more particularly to a high-barrier gate and tri-step doped channel field-effect transistor 2. Description of Prior Art Recently, many semiconductor devices with the very thin and sharply doped layer have been developed because of the advancement of film growth techniques, such as MOCVD and MBE and so on. Among them, the $Ga_{0.51}In_{0.49}P$ epitaxial layer lattices matched to GaAs have been received much attention. GaInP material has the advantages of (1) lower deep level trap; (2) highly selective etch ration between GaInP and GaAs materials; (3) large break down voltage; (4) larger valance band discontinuity between GaInP and GaAs materials; (5) the elimination of DX centers and thermal oxidation as compared to AlGaAs. Therefore, GaInP/GaAs heterostructure has been widely used in high speed and microwave devices, such as heterojunction bipolar transistors (HBT) or heterojunction field-effect transistors (HFET), etc.

SUMMARY OF THE INVENTION

As mentioned above, due to the excellent characteristics of GaInP epitaxial layer. The object of this invention is to provide a high-barrier gate and tri-step doped channel field-effect transistor with an $n^+$-GaAs/$p^+$-GaInP/n-GaAs heterojunctions. The channel contains tri-step doped GaAs layers with different doping level and thickness in each layer. Due to the significant conduction band discontinuity $\Delta E_C$ between the GaInP/GaAs heterointerface in the gate region, the gate barrier is increased and electrons are effectively confined in the channel. Furthermore, the existence of a valance band discontinuity $\Delta E_v$ at the GaInP/GaAs heterointerface may prevent holes generated by impact ionization from reaching the gate regime. The tri-step doped channel can increase the output current and linear transconductance. The device of this invention has the characteristics of high gate-drain breakdown voltage, low leakage current and high transconductance, etc. Based on these advantages, the device shows promise in high-power, large signal analog and digital switching circuit applications.

Moreover, the "camel gate"-like structure has the following advantages: (1) the ohmic contact gate can eliminate the difficulty of making a metal-semiconductor contact; (2) the gate barrier height is large and adjustable, however it is not fixed and is affected by the applied gate voltages; (3) the potential for improving reliability under conditions of high power dissipation.

BRIEF DESCRIPTION OF THE DRAWINGS

The following detailed description, given by way of example and not intended to limit the invention solely, will best be understood in conjunction with the accompanying drawings in which.

DETAILED DESCRIPTION OF THE PREFERRED EMBODIMENTS

Figure 1:
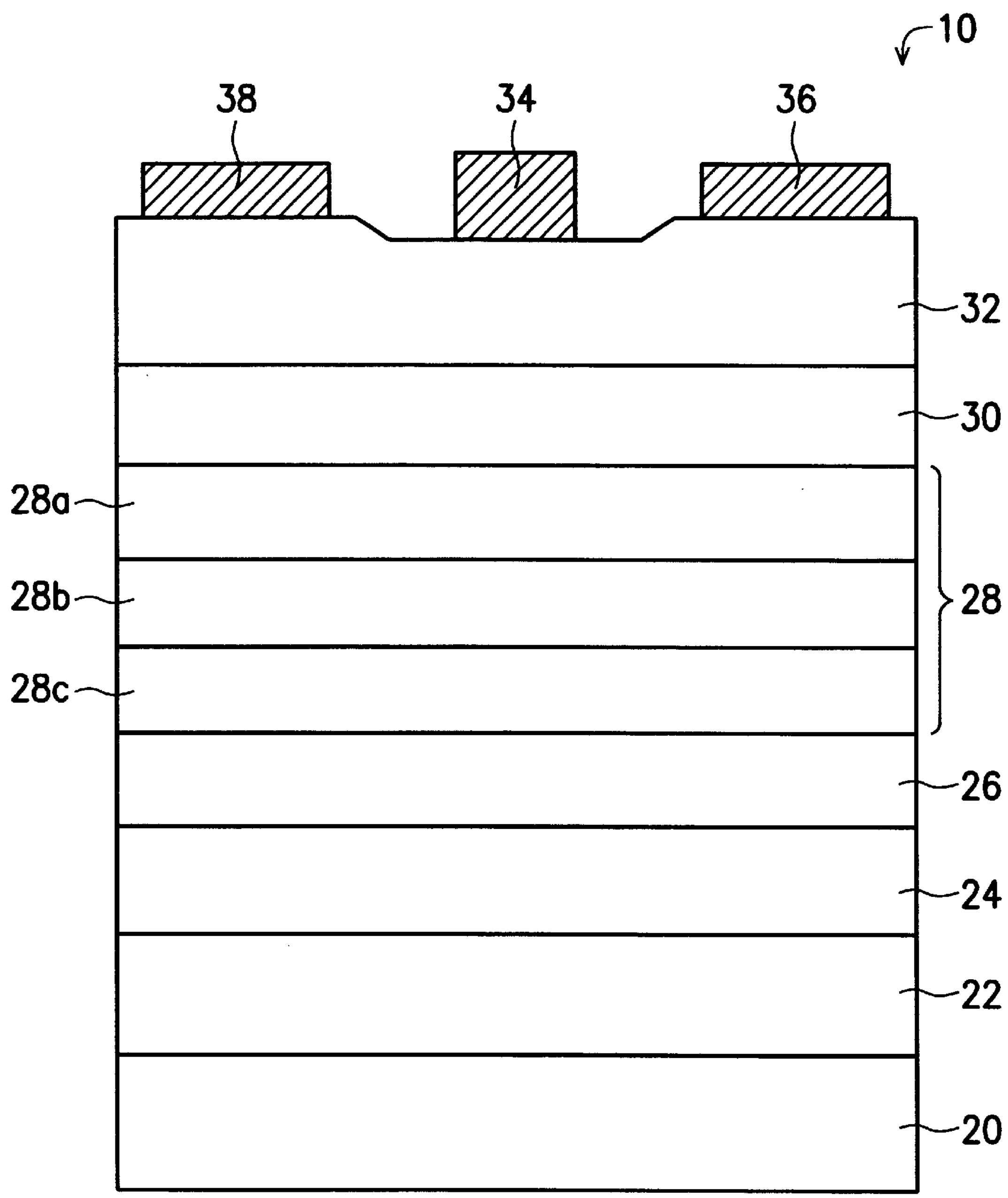
FIG. 1 illustrates a high-barrier gate and tri-step doped channel field-effect transistor with an $n^+$-GaAs/$p^+$GaInP/n-GaAs heterojunctions according to this invention.

Referring to FIG. 1, from bottom to top, the device of this invention contains: a semi-insulating GaAs substrate 20; a layer of undoped GaAs 22 with a thickness of 0.5 $\mu$m; a layer of $p^+$-GaAs 24 with a thickness of 50 Å and a concentration of $8\times10^{18}cm^{-3}$; a layer of undoped GaAs 26 with a thickness of 500 Å; a tri-step n-doped GaAs channel which comprises a first step **28*c* with a thickness of 200 Å and a concentration of $5\times10^{17}cm^{-3}$, a second step 28*b* with a thickness of 400 Å and a concentration of $2.5\times10^{17}cm^{-3}$, and a third step 28*a* with a thickness of 1000 Å and a concentration of $1\times10^{17}cm^{-3}$; a layer of $p^+$-GaInP 30 with a thickness of 100 Å and a concentration of $6\times10^{18}cm^{-3}$; a ohmic contact layer of $n^+$-GaAs 32 with a thickness of 300 Å and a concentration of $6\times10^{18}cm^{-3}$; and gate metal Au 34 and drain and source metals Au/Ge/Ni 36 and 38, serving as an ohmic contact, deposited on the $n^+$-GaAs layer 32**, respectively.

Figure 2:
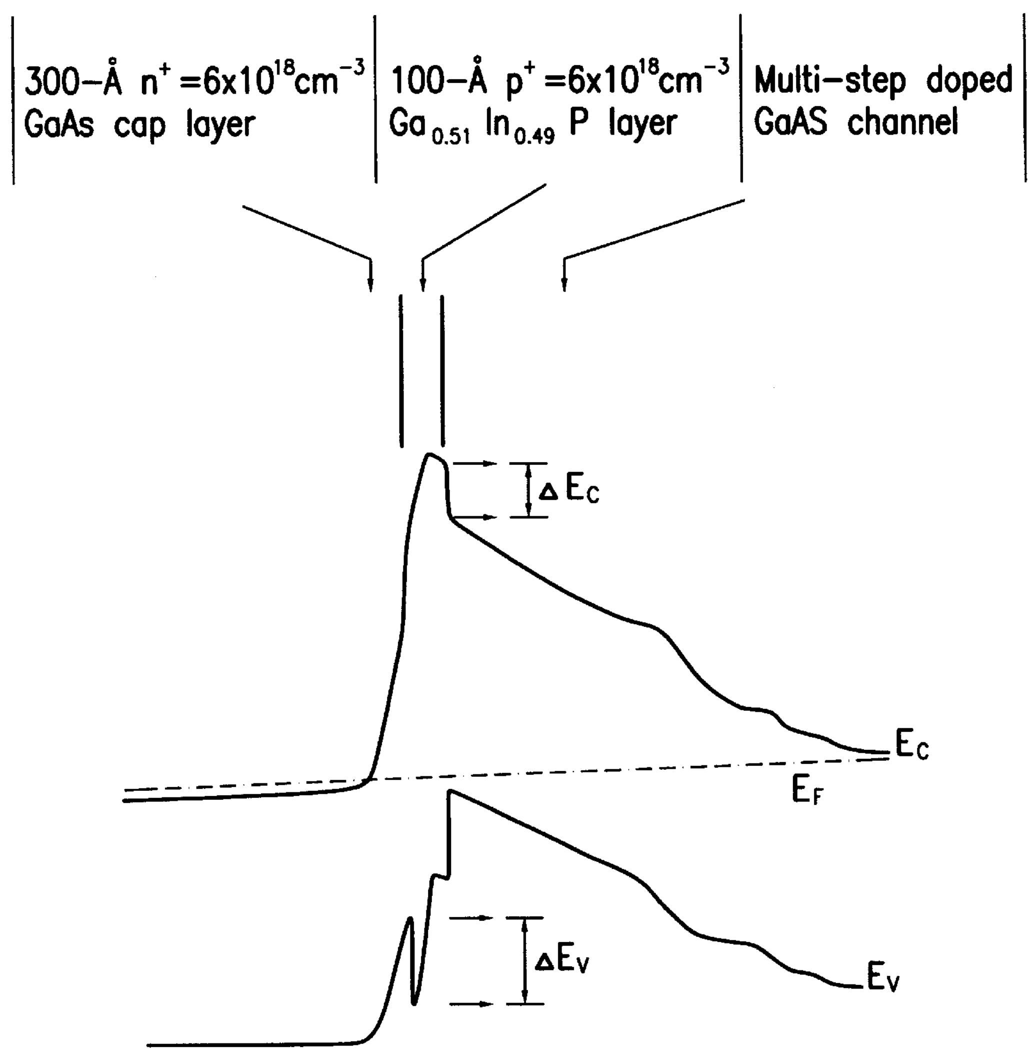
FIG. 2 illustrates the energy-band diagram for the devices of this invention.

FIG. 2 shows the energy-band diagram for the device of this invention, $E_C$ represents the conduction band discontinuity, $E_F$ represents the Fermi level, and $E_v$ represents the valance band discontinuity. It is found that a conductance band discontinuity $\Delta E_C$ of about 200 meV existed between the aInP/GaAs heterointerface in the gate region, thus electrons are effectively confined in the channel. This can improve the transconductance and reduce the leakage current. In addition, the existence of $\Delta E_v$, which is about 300 meV, at the GaInP/GaAs heterointerface may prevent holes generated by impact ionization from reaching the gate region. Thus a higher gate-drain breakdown voltage can be obtained.

Figure 3:
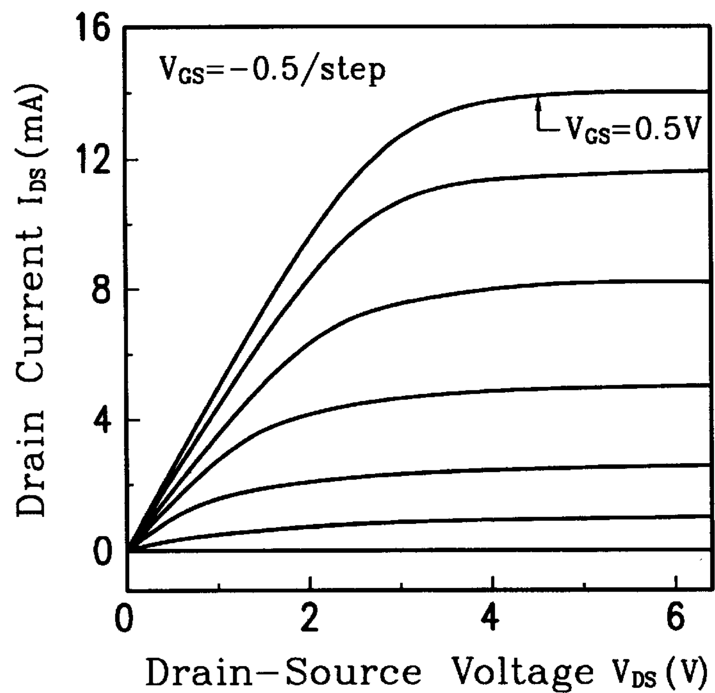
FIG. 3 illustrates the current-voltage curve of the devices according to this invention.

FIG. 3 shows the characteristics of the current-voltage of the device in this invention. The transversal axis indicates the drain-source voltage ($V_{DS}$) with a scale of 1 V. The longitudinal axis indicates the drain current ($I_{DS}$) with a scale of 2 mA. The gate-source voltage ($V_{GS}$) is −0.5V/step. It is found that the device of this invention has an excellent pinch-off behavior, the threshold voltage is about −2.5 V. For a gate dimension of $1\times50\ \mu m^2$, the cut-off frequency (ft) is 17 GHz, which is measured by using an HP8510B Network Analyzer manufactured by HEWLETT PACKARD Co.

Figure 4:
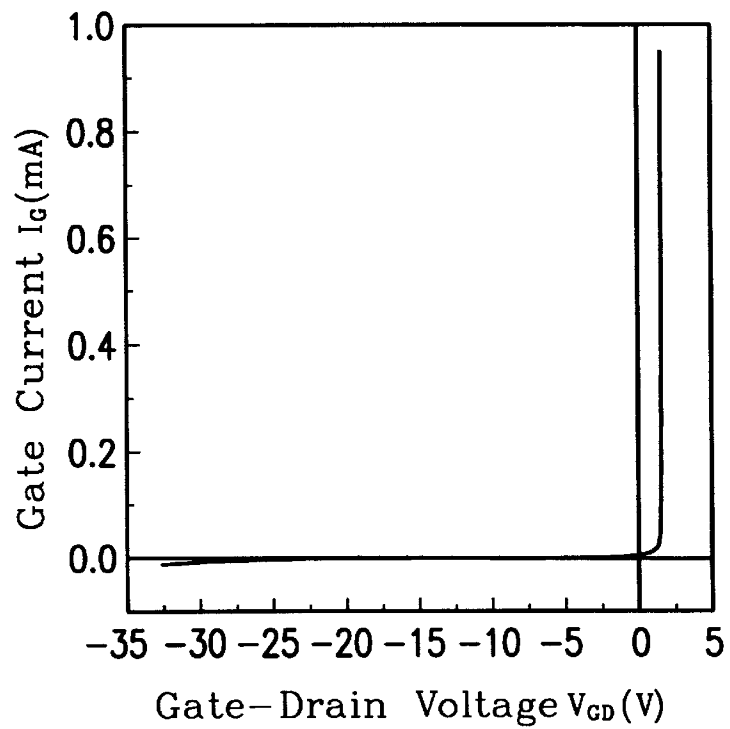
FIG. 4 illustrates the gate current-voltage curve of the devices according to this invention.

FIG. 4 shows the characteristics of the gate current-voltage of the device. The transversal axis represents the gate-drain voltage ($V_{GD}$) with a scale of 2.5V. The longitudinal axis indicates the gate current ($I_G$) with a scale of 0.1 mA. It is found that the gate leakage current is only 250 $\mu$A/mm when the gate breakdown voltage is 33 V. Such a superior characteristic is in agreement with the corresponding band diagram of FIG. 2.

Figure 5:
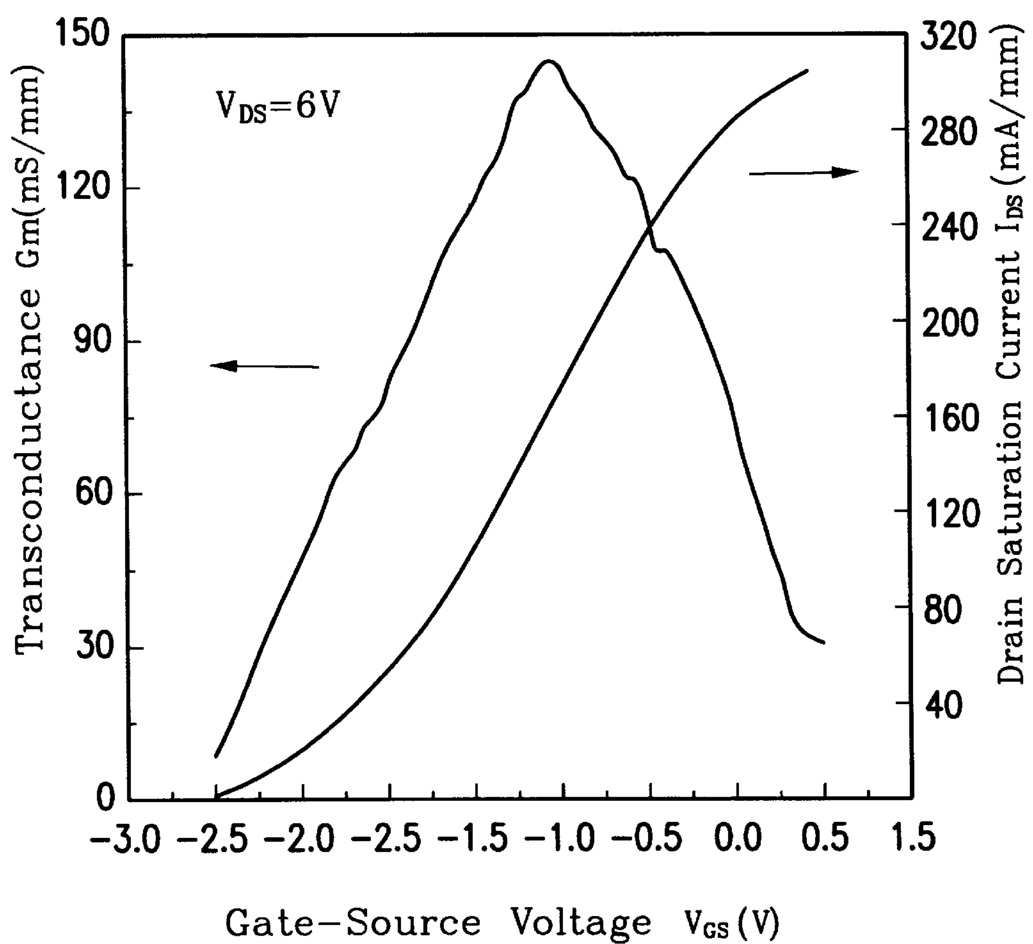
FIG. 5 shows the relation of drain saturation current, transconductance, and gate voltage when the drain-source voltage is 6 V.

FIG. 5 shows the relation of drain saturation current, transconductance, and gate voltage for the device of this invention. The drain-source voltage is 6 V. The transversal axis represents the gate-source voltage ($V_{GS}$) with a scale of 0.25V. The left longitudinal axis represents the transconductance with a scale of 15 mS/mm. The right longitudinal axis indicates the drain saturation current ($I_{DS}$) with a scale of 40 mA/mm. The maximum transconductance is 140 mS/mm when the gate-source voltage is −0.5 V, for a $1\times50\ \mu m^2$ gate device.

While the present invention has been particularly shown and described with reference to a preferred embodiment, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A high-barrier gate and tri-step doped channel field-effect transistor comprising:

a GaAs substrate;

a first undoped GaAs layer formed on said GaAs substrate;

a $p^+$ doped GaAs layer formed on said first undoped layer:

a second undoped GaAs layer formed on the $p^+$ doped GaAs layer formed on the $p^+$ doped GaAs;

a tri-step n doped GaAs channel layer formed on said second undoped GaAs layer;

a $p^+$ doped GaInP layer formed on tri-step n-doped GaAs channel layer so that a conductance band discontinuity occurs between a heterointerface of the $p^+$ doped GaInP layer and the n doped GaAs channel layer in a gate region and causes electrons to be substantially confined in the channel layer, and a valance band discontinuity occurs at the heterointerface of the $p^+$ doped GaInP layer and the n doped GaAs channel layer and inhibits holes generated by impact ionization from reaching the gate region;

an $n^+$ doped GaAs ohmic contact layer formed on said $p^+$ doped GaInP layer;

a first metal layer formed on the $n^+$ doped GaAs ohmic contact layer to serve as an gate electrode; and a pair of second metal layers, formed on the $n^+$ doped GaAs ohmic contact, respectively serving as the drain and source electrodes of said field effect transistor.

2. A high-barrier gate and tri-step doped channel field-effect transistor as claimed in claim 1, wherein said substrate is made of a semi-insulating GaAs.

3. A high-barrier gate and tri-step doped channel field-effect transistor as claimed in claim 1, wherein the first metal layer is gold.

4. A high-barrier gate and tri-step doped channel field-effect transistor as claimed in claim 3, wherein the first metal layer has a thickness of about 3000 Å.

5. A high-barrier gate and tri-step doped channel field-effect transistor as claimed in claim 1, wherein the pair of second metal layers are made of Au/Ge/Ni alloy.

6. A high-barrier gate and tri-step doped channel field-effect transistor as claimed in claim 5, wherein the second metal layer has a thickness of about 3000 Å.

7. A high-barrier gate and tri-step doped channel field-effect transistor as claimed in claim 1, wherein the first undoped GaAs layer has a thickness of 0.5 $\mu$m.

8. A high-barrier gate and tri-step doped channel field-effect transistor as claimed in claim 1, wherein the p doped GaAs layer has a thickness of 50 Å and a concentration of $8\times10^{18}$ $cm^{-3}$.

9. A high-barrier gate and tri-step doped channel field-effect transistor as claimed in claim 1, wherein the second undoped GaAs layer has a thickness of 500 Å.

10. A high-barrier gate and tri-step doped channel field-effect transistor as claimed in claim 1, wherein the tri-step n doped GaAs channel layer comprises a first step having a thickness of 200 Å and a concentration of $5\times10^{l7}$ $cm^{-3}$, a second step having a thickness of 400 Å and a concentration of $2.5\times10^{17}$ $cm^{-3}$ and a third step having a thickness of 1000 Å and a concentration of $1\times10^{17}$ $cm^{-3}$.

11. A high-barrier gate and tri-step doped channel field-effect transistor as claimed in claim 1, wherein the p-doped GaAs layer has a thickness of 100 Å and a concentration of $6\times10^{18}$ $cm^{-3}$.

12. A high-barrier gate and tri-step doped channel field-effect transistor as claimed in claim 1, wherein the $n^+$ doped GaAs ohmic contact layer has a thickness of 300 Å and a concentration of $6\times10^{18}cm^{-3}$.

* * * * *